United States Patent [19]

Wink

[11] Patent Number: 5,003,397

[45] Date of Patent: Mar. 26, 1991

[54] TELEVISION RECEIVER INCLUDING A TUNING CIRCUIT WHICH COMPRISES A FREQUENCY SYNTHESIS CIRCUIT

[75] Inventor: Meye Wink, Eindhoven, Netherlands

[73] Assignee: U.S. Philips Corporation, New York, N.Y.

[21] Appl. No.: 377,685

[22] Filed: Jul. 10, 1989

[30] Foreign Application Priority Data

Jul. 26, 1988 [NL] Netherlands ........................ 8801874

[51] Int. Cl.[5] ............................................ H04N 5/50

[52] U.S. Cl. ............................ 358/195.1; 358/191.1; 455/182; 455/192; 455/165

[58] Field of Search ............... 358/191.1, 192.1, 193.1, 358/195.1; 455/161, 150, 164, 165, 169, 173, 182, 183, 184, 192, 195

[56] References Cited

U.S. PATENT DOCUMENTS

| | | | |
|---|---|---|---|
| 4,240,115 | 12/1980 | Kamiya | 358/195.1 |
| 4,305,157 | 12/1981 | Miogi | 455/182 |
| 4,408,349 | 10/1983 | Yukawa | 455/182 |
| 4,485,404 | 11/1984 | Tults | 358/195.1 |
| 4,543,614 | 9/1985 | Chen | 358/193.1 |
| 4,556,988 | 12/1985 | Yoshisato | 455/182 |
| 4,689,685 | 8/1987 | Testin et al. | 455/192 |
| 4,727,591 | 2/1988 | Manlove | 455/182 |
| 4,776,038 | 10/1988 | Testin et al. | 455/182 |
| 4,811,096 | 3/1989 | Gakumura | 358/188 |
| 4,817,195 | 3/1989 | Kubo et al. | 455/182 |
| 4,843,636 | 6/1989 | Hendriks et al. | 455/192 |
| 4,919,640 | 4/1990 | Yanagibori | 455/165 |

*Primary Examiner*—Howard W. Britton
*Assistant Examiner*—Michael H. Lee
*Attorney, Agent, or Firm*—Edward W. Goodman

[57] ABSTRACT

In a television receiver including a frequency synthesis circuit (33) controlled by a phase detection circuit (21), in which an adjustable frequency divider (15) receives a tuning datum which is corrigible by means of an AFC circuit (119, 129), a synchronous video signal detector (57) with a reference signal oscillator (97) are used, while the AFC detector is a counter (119) which is coupled via a measuring gate (115) to an output (99) of the reference signal oscillator, and the measuring gate (115) is operatd by a measuring gate signal having an accurate periodicity being derived from a received television signal, so that a minimum possible number of terminals on an integrated circuit is sufficient.

1 Claim, 1 Drawing Sheet

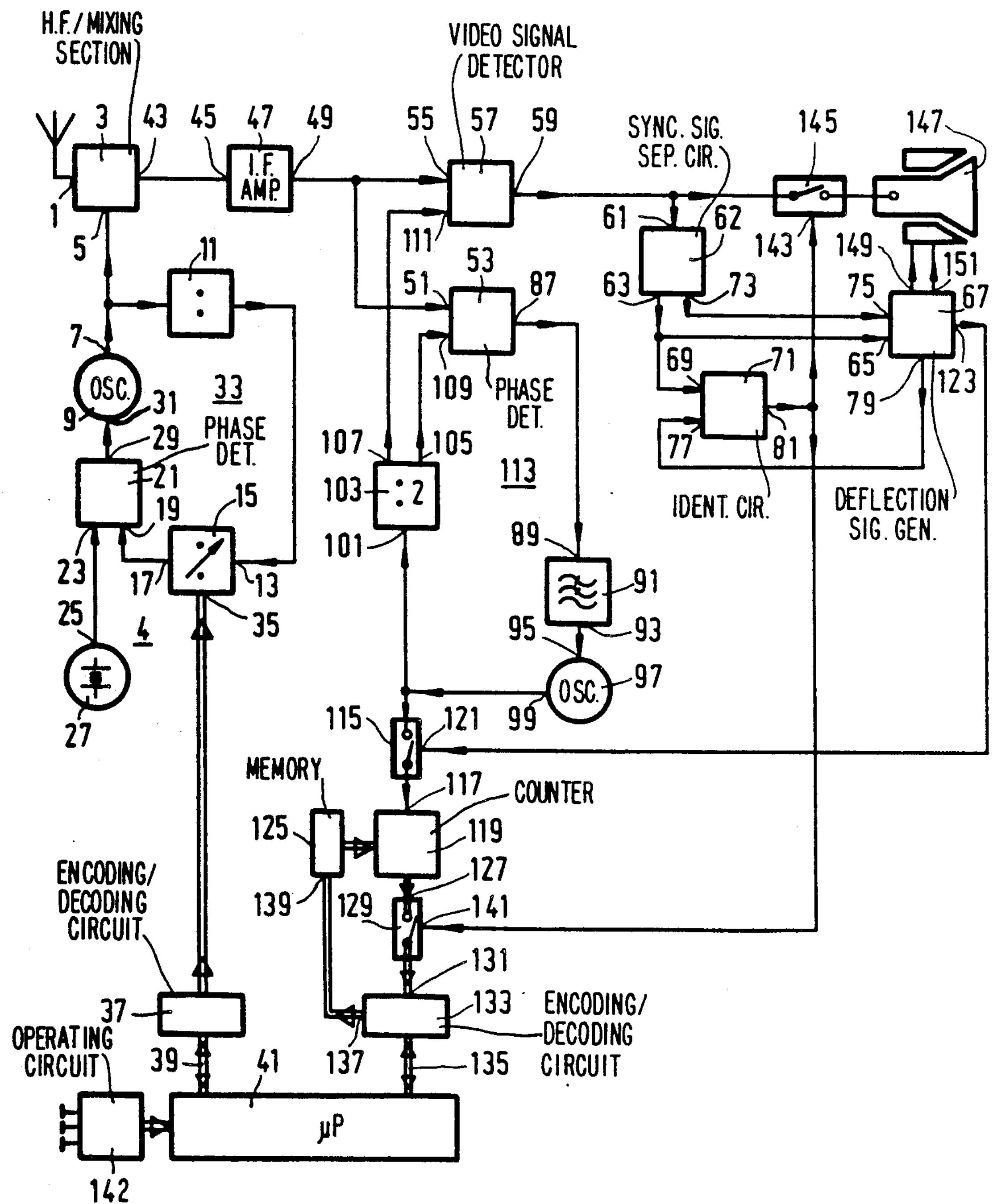
H.F./MIXING SECTION
VIDEO SIGNAL DETECTOR
SYNC. SIG. SEP. CIR.
I.F. AMP.
OSC.
PHASE DET.
PHASE DET.
IDENT. CIR.
DEFLECTION SIG. GEN.
OSC.
MEMORY
COUNTER
ENCODING/ DECODING CIRCUIT
ENCODING/ DECODING CIRCUIT
OPERATING CIRCUIT
μP

TELEVISION RECEIVER INCLUDING A TUNING CIRCUIT WHICH COMPRISES A FREQUENCY SYNTHESIS CIRCUIT

BACKGROUND OF THE INVENTION

1. Field of the Invention

The invention relates to a television receiver including a tuning circuit which comprises a frequency synthesis circuit in which the tuning of a tuning oscillator is obtained by means of a frequency divider which is adjustable by means of a tuning datum, said tuning datum being corrigible by means of a frequency detection circuit when receiving a television signal identified as being correct by an identification circuit, said frequency detection circuit being coupled to an output of an intermediate frequency amplifier, an input of which is coupled to an output of the tuning circuit.

2. Description of Related Art

A television receiver of this type, using a frequency discriminator as a frequency detection circuit, is known from U.S. Pat. No. 4,025,953. The output voltage of this frequency discriminator is coverted into digital signals by means of threshold circuits, with which signals the tuning datum is adjustable. This tuning datum adjusts the frequency divider which is incorporated in a reference signal path of the frequency synthesis circuit.

In modern television receivers, a maximum possible number of integrated circuits is used, trying to incorporate the largest possible part of the tuning circuit in a first integrated circuit and the largest possible part of intermediate frequency and detection circuits in a second integrated circuit. It must then be ensured that these integrated circuits have a minimum number of terminals.

SUMMARY OF THE INVENTION

It is an object of the invention to improve the integrability of circuits for a television receiver by reducing connection signal paths between different parts of the television receiver which, dependent on their nature, can be accommodated in different integrated circuits.

According to the invention, a television receiver of the type described in the opening paragraph is therefore characterized in that the frequency detection circuit is a counter which is coupled at least via a measuring gate to an output of a reference signal oscillator which forms part of a phase-coupled loop coupled to an output of the intermediate frequency amplifier, an output of said reference signal oscillator being further coupled to a reference signal input of a synchronous video signal detector, while the measuring gate is operable by means of a measuring gate signal synchronized with the line frequency of a received television signal.

If the frequency detection circuit is formed as a counter, a circuit which would require terminals on an integrated circuit is not necessary, while moreover a digital datum for a correction signal is obtained without conversion. The operation of the measuring gate by way of the above-mentioned measuring gate signal does not require any connection for a frequency standard. The measuring gate signal is used as a frequency standard for measuring the intermediate frequency. The measurement of the intermediate frequency at the output of the reference signal oscillator for the video detector has the advantage that this measurement is insensitive to noise and takes place on a signal having a constant amplitude. The frequency at which the reference signal oscillator oscillates is equal to or coupled to the picture intermediate frequency. This frequency or a frequency derived therefrom is measured by the counter and controlled at the correct value via the correction of the tuning datum for the tuning circuit.

BRIEF DESCRIPTION OF THE DRAWING

The invention will now be described in greater detail with reference to the accompanying drawing.

The drawing comprises a sole FIGURE showing a concise block diagram of a television receiver according to the invention.

DESCRIPTION OF THE PREFERRED EMBODIMENT

In the Figure a received television signal is applied to an input 1 of a high-frequency and mixing section 3 of a tuning circuit 4. An output 7 of a tuning oscillator 9 is connected to a further input 5 of the mixing circuit 3. The output 7 of the tuning oscillator 9 is further connected via a frequency divider 11 having a fixed dividing factor to an input 13 of a frequency divider 15 having an adjustable dividing factor. An output 17 of the frequency divider 15 is connected to an input 19 of a phase detector 21, a further input 23 of which is connected to an output 25 of a stable oscillator 27. An output 29 of the phase detector 21 is connected to a control signal input 31 of the tuning oscillator 9. The frequency dividers 11 and 15, the stable oscillator 27, the phase detector 21 and the tuning oscillator 9 constitute a frequency synthesis circuit 33 whose operation may be assumed to be known and whose tuning is determined by a tuning datum to be applied to an input 35 of the frequency divider 15, which datum is obtained from a microprocessor 41 via an encoding and decoding circuit 37 and a bus connection 39.

An output 43 of the high-frequency and mixing circuit 3 applies an intermediate frequency signal to an input 45 of an intermediate frequency amplifier 47, which signal is filtered and amplified and is applied via an output 49 of said amplifier to an input 51 of a phase detector 53 and to an input 55 of a synchronous video signal detector 57.

An output 59 of the synchronous video signal detector 57 is connected to an input 61 of a synchronizing signal separating circuit 62, an output 63 of which applies a horizontal synchronizing signal to an input 65 of a deflection signal generator 67 and to an input 69 of an identification circuit 71. An output 73 of the synchronizing signal separating circuit 62 applies a vertical synchronizing signal to an input 75 of the deflection signal generator 67. An input 77 of the identification circuit 71 receives from an output 79 of the deflection signal generator 67 a signal, generated by said generator, of the horizontal deflection frequency which is a synchronized state of the deflection signal generator 67 coincides with the horizontal synchronizing signal at the input 69 of the identification circuit 71. An output 81 of the identification circuit then supplies an identification signal which indicates that the received television signal is correct.

An output 87 of the phase detector 53 is connected to an input 89 of a low-pass filter 91. An output 93 of the low-pass filter 91 is connected to a control signal input 95 of a reference signal oscillator 97, an output 99 of which is connected to an input 101 of a frequency halving circuit 103. Outputs 105 and 107 of the frequency halving circuit 103 then apply an intermediate frequency reference signal to reference signal inputs 109 and 111, respectively, of the phase detector 53 and the synchronous video signal detector 57, respectively. These reference signals are mutually shifted 90° in phase.

The reference signal oscillator 97, the frequency halving circuit 103, the phase detector 53 and the filter 91 constitute a phase-coupled loop 113. This loop controls the frequency of the reference signal at the input 109 of the phase detector 53 so that it becomes equal to the picture intermediate frequency of the intermediate frequency signal at the input 51 of the phase detector 53 and the phase differs ninety degrees from that of the signal at the input 51 of the phase detector 53.

The output 99 of the reference signal oscillator 97 is further connected via a measuring gate 115 to a counting signal input 117 of a counter 119. The measuring gate 115 is operated by a measuring gate signal applied to an input 121 thereof, which signal orginates from an output 123 of the deflection signal generator 67. This measuring gate signal periodically occurs at, for example, half the line frequency and it closes the measuring gate 115 each time during a line period of the received television signal. This measuring gate signal may be suppressed, for example, each time at the start of a frame because then a signal originating from a video recorder does not yet have the correct frequency.

The counter 119 receives the desired value to be counted corresponding to the correct intermediate frequency from a memory circuit 125 and applies a digital signal to an output 127, which signal indicates the deviation of the counter value with respect to this desired value.

The output 127 of the counter 119 is connected via a switch 129 to an encoding and decoding circuit 133 which is connected to the microprocessor 41 via a bus connection 135. Via an output 137, which is connected to an input 139 of the memory circuit 125, the desired intermediate frequency may be adapted to, for example a possible deviation in a filter of the intermediate frequency amplifier 47.

The switch 129 has an operating signal input 141 which receives the identification signal from the output 81 of the identification circuit 71 in the case of reception of a correct television signal. The switch 129 then closes so that the deviation, measured by the counter 119, of the desired intermediate frequency is passed on to the microprocesor 41 via the encoding and decoding circuit 133 and the bus connection 135. The microprocessor 41 subsequently corrects the tuning datum applied to the adjustable frequency divider 15 and generated for a desired television channel to be received under the influence of an operating circuit 142, until the deviation measured by the counter 119 has dropped below a given value.

The identification signal is also applied, for example, from the output 81 of the identification circuit 71 to an operating signal input 143 of a switch 145 by which a video signal originating from the output 59 of the synchronous video signal detector 57 is passed on to a picture display device 147 for the purpose of display. The picture display device 147 further receives horizontal and vertical deflection signals from two outputs 149, 151 of the deflection signal generator 67.

Since the identification signal is a digital signal and the switch 129 can be realized by a gate function, the function of this switch can be performed in the microprocessor 41, if desired, if the identification signal is applied via the encoding an decoding circuit 133 thereto.

The identification circuit 71 is shown here as a simple coincidence circuit for a line frequency synchronizing signal and for a line fequency signal obtained from a deflection signal genertor. It will be evident that, if desired, for example, other identification circuits examining, for example the vertical synchronizing signal or the total synchronizing signal pattern can be used.

It is of course also possible to connect the input of the measuring gate 115 to one of the outputs 105 or 107 of the frequency hálving circuit 103.

Instead of suppressing the measuring gate signal each time at the start of a frame, as mentioned hereinbefore, it is possible to have the microprocessor suppress the output signal of the counter 119 during the start of each frame.

I claim:

1. A television receiver including a tuning circuit which comprises a frequency synthesis circuit in which the tuning of a tuning oscillator is obtained by means of a frequency divider which is adjustable by means of a tuning datum, said tuning datum being corrigible by means of a frequency detection circuit when receiving a television signal identified as being correct by an identification circuit, said frequency detection circuit being coupled to an output of an intermediate frequency amplifier, an input of which is coupled to an output of the tuning circuit, characterized in that the frequency detection circuit is a counter which is coupled at least via a measuring gate to an output of a reference signal oscillator which forms part of a phase-coupled loop coupled to an output of the intermediate frequency amplifier, an output of said reference signal oscillator being further coupled to a reference signal input of a synchronous video signal detector while the measuring gate is operable by means of a measuring gate signal synchronized with the line frequency of a received television signal.

* * * * *